(12) United States Patent
Jiruse et al.

(10) Patent No.: US 10,504,694 B2
(45) Date of Patent: Dec. 10, 2019

(54) SCANNING ELECTRON MICROSCOPE AND METHOD OF USE THEREOF

(71) Applicant: TESCAN Brno, s.r.o., Brno (CZ)

(72) Inventors: Jaroslav Jiruse, Blankso (CZ); Filip Lopour, Brno (CZ); Milos Havelka, Zbysov (CZ); Jan Polster, Brno (CZ); Josef Rysavka, Lulec (CZ); Martin Zadrazil, Brno (CZ)

(73) Assignee: TESCAN Brno, s.r.o., Brno (CZ)

( * ) Notice: Subject to any disclaimer, the term of this patent is extended or adjusted under 35 U.S.C. 154(b) by 0 days.

(21) Appl. No.: 15/601,547

(22) Filed: May 22, 2017

(65) Prior Publication Data

US 2017/0338078 A1 Nov. 23, 2017

(30) Foreign Application Priority Data

May 21, 2016 (CZ) .................. PV 2016-300

(51) Int. Cl.
*H01J 37/26* (2006.01)
*H01J 37/12* (2006.01)
*H01J 37/141* (2006.01)
*H01J 37/147* (2006.01)
*H01J 37/28* (2006.01)

(52) U.S. Cl.
CPC ............ *H01J 37/263* (2013.01); *H01J 37/12* (2013.01); *H01J 37/141* (2013.01); *H01J 37/1475* (2013.01); *H01J 37/28* (2013.01)

(58) Field of Classification Search
CPC .......... H01J 37/00; H01J 37/02; H01J 37/023; H01J 37/04; H01J 37/05; H01J 37/10; H01J 37/12; H01J 37/14; H01J 37/141; H01J 37/1413; H01J 37/1416; H01J 37/143; H01J 37/145; H01J 37/147; H01J 37/1474; H01J 37/153; H01J 37/21; H01J 37/26; H01J 37/261; H01J 37/263
USPC ......................................... 250/306, 307, 311
See application file for complete search history.

(56) References Cited

U.S. PATENT DOCUMENTS

| | | | | |
|---|---|---|---|---|
| 4,623,783 A | * | 11/1986 | Kondo | H01J 37/2955 250/310 |
| 5,124,556 A | | 6/1992 | Takashima | |
| 6,057,533 A | * | 5/2000 | Ahn | H05B 6/6435 200/38 FA |
| 6,057,553 A | * | 5/2000 | Khursheed | H01J 37/14 250/442.11 |
| 7,223,983 B2 | | 5/2007 | Kawasaki | |

(Continued)

FOREIGN PATENT DOCUMENTS

| | | |
|---|---|---|
| EP | 0708975 A1 | 10/1995 |
| JP | 2969219 B | 2/1999 |

*Primary Examiner* — Jason L McCormack
(74) *Attorney, Agent, or Firm* — Thedford I. Hitaffer; Hitaffer & Hitaffer, PLLC

(57) ABSTRACT

A scanning electron microscope comprises three objective lenses, including a distant objective lens and a close objective lens, which are of conventional type, and an immersion objective lens of the immersion type below the distant objective lens and the close objective lens. These three objective lenses can be controlled independently, therefor different combinations of active objective lenses can be achieved. The scanning electron microscope therefore offers various imaging modes. There is a possibility to switch between these imaging modes and therefore, choose the most suitable way of imaging for given application.

25 Claims, 12 Drawing Sheets

(56) References Cited

U.S. PATENT DOCUMENTS

| | | | |
|---|---|---|---|
| 7,705,298 B2 | 4/2010 | Liu | |
| 2003/0089859 A1* | 5/2003 | Adamec | H01J 37/141 |
| | | | 250/396 ML |
| 2008/0121810 A1* | 5/2008 | Liu | H01J 37/145 |
| | | | 250/396 ML |
| 2008/0302965 A1* | 12/2008 | Harada | H01J 37/26 |
| | | | 250/311 |
| 2010/0301211 A1* | 12/2010 | Miller | H01J 37/09 |
| | | | 250/307 |
| 2012/0228494 A1* | 9/2012 | Kuan | G01N 23/2251 |
| | | | 250/307 |
| 2012/0300056 A1* | 11/2012 | Ban | H01J 37/21 |
| | | | 348/80 |
| 2015/0136977 A1* | 5/2015 | Buxbaum | G01N 1/32 |
| | | | 250/307 |

* cited by examiner

SCANNING ELECTRON MICROSCOPE AND METHOD OF USE THEREOF

CROSS-REFERENCE TO RELATED APPLICATIONS

This application claims priority from CZ Patent Application No. PV 2016-300, filed May 21, 2016, the disclosure of which is incorporated herein by reference.

FIELD OF THE INVENTION

The present invention relates to an arrangement of lenses in scanning electron microscopes which enables imaging modes for high resolution, large depth of focus and wide field of view. A range of imaging modes is available to the user because of the use of three objective lenses.

BACKGROUND OF THE INVENTION

Scanning electron microscopes comprise a source of primary electrons, a condenser lens regulating a primary electron beam, an aperture lens, an objective lens, scanning and centering elements and a detector. The condenser lens regulates the primary electron beam. The objective lens is usually electromagnetic. Such lens consists of a coil with a current passing through the coil and of a yoke made of magnetic material forming a part of the magnetic circuit of the lens. The coil can have one, two or more windings, which can be used for maintaining a constant heat output of the coil while changing the intensity of the magnetic field generated by the lens. The magnetic field which forms the electron beam is generated between the so-called polepieces in the place of the interruption of the yoke. The electromagnetic lens can be a conventional lens or an immersion lens. The conventional lens has two polepieces with an axial gap in which the magnetic field of the lens locally affects the primary electron current (electron beam) and the magnetic field does not extend significantly to the area where the sample is located. The immersion lens can either have single polepiece, in such case the magnetic field closes over the microscope chamber, or the lens can have two polepieces with a radial gap. When using the immersion lens, the examined sample is immersed into the magnetic field generated by the lens. The advantage of the immersion lenses over the conventional ones lies in decrease in the optical aberrations of imaging and in improvement of the resolution of the electron microscope.

The electromagnetic lenses can be also substituted by electrostatic lenses which utilize electrodes instead of coils, optionally a combined lens can be created by combining coils, magnetic circuit and electrodes.

A drawback of a common scanning electron microscope is that it can usually utilize only one objective lens with given properties and therefore has a very limited number of levels of configuration freedom of the microscope imaging modes. If, for example, the objective lens is optimized for high resolution, it has usually relatively small field of view and a small depth of focus. The aperture diaphragm and condenser adjust the aperture angle of the primary beam together with the desired current of electrons passing through the aperture diaphragm. However, for the objective lens focusing the primary electron beam onto the sample, there is only a relatively small range of the electron current which corresponds to the aperture angle required for the optimal resolution in this arrangement. Therefore, when changing the current of passed electrons (and thereby also when changing the aperture angle), the resolution of the objective lens decreases.

If, for example, the objective is set for the optimal aperture angle corresponding to the small current, it loses its resolution for high currents.

This drawback is eliminated in U.S. Pat. No. 5,124,556. The document generally describes the arrangement of two condenser lenses, aperture diaphragm and two objective lenses, out of which one objective lens is auxiliary and serves for the aperture angle control of a charged particle beam incident on the examined sample. Said arrangement allows maintaining optimal aperture with a wider range of currents of the primary electron beam impinging the sample. The drawback of this arrangement is a relatively small field of view.

U.S. Pat. No. 7,705,298 describes a device comprising three condenser lenses (two electromagnetic and one electrostatic) and an objective lens which is a combination of an electromagnetic immersion double polepiece lens and an electrostatic lens. These objective lenses shape the electromagnetic and electrostatic field for focusing the primary electron beam onto the sample. This device further comprises quickly responding electromagnetic auxiliary lens which serves for quick change in the focus of the beam on the vertically topographic sample. However, this document does not disclose the possibility to use multiple imaging modes, and the auxiliary lens cannot serve, due to its properties, for imaging, but only as a supplement to the main objective lens.

Patent EP0708975 describes an arrangement of two objective lenses, the objective lens located closer to the sample being the immersion lens and the objective lens further from the sample being the conventional lens. However, these two lenses do not work in cooperation, they switch between imaging by means of the immersion lens for the highest resolution and imaging by means of the conventional lens for the mode without magnetic field on the sample, which is suitable for example for samples from magnetic materials. Moreover, the possibility of using multiple imaging modes is not mentioned.

The device disclosed in the patent JP2969219 comprises two condenser lenses and two objective lenses. The objective lenses are electromagnetic and they are arranged identically to the ones in the solution disclosed in EP0708975. One electromagnetic objective lens is conventional, the other electromagnetic objective lens is the immersion lens. The drawback of both of these solutions is that both lenses are arranged as close to the sample as possible to achieve the biggest resolution and therefore it is not possible to achieve large field of view which is important mainly for easy navigation on the sample.

U.S. Pat. No. 7,223,983 describes an arrangement of at least one condenser lens, two deflection coils for regulation of the electron beam direction, subsequently, the detector of secondary electrons, scanning coils, auxiliary objective lens and objective lens are arranged. Said elements of the microscope configuration have electromagnetic character. The device allows beam deflection at large angle with the image undistorted. The possibility of using multiple imaging modes is not mentioned here either.

Therefore, the possibility of achieving imaging modes for high resolution, increased depth of focus and large field of view in the same device and for range of electron currents is not provided by any of the known devices for ultra-high resolution.

SUMMARY OF THE INVENTION

Therefore, the possibility of achieving imaging modes for high resolution, increased depth of focus and large field of view in the same device and for range of electron currents is not provided by any of the known devices for ultra-high resolution.

The present invention discloses a scanning electron microscope with at least one condenser lens and three objective lenses and a number of imaging modes of such microscope.

The scanning electron microscope comprises a source of primary electrons, at least one condenser lens, an aperture diaphragm, scanning coils, at least one detector of signal electrons, a sample holder, a distant objective lens arranged between the condenser lens and the sample holder, an immersion objective lens arranged between the distant objective lens and the sample holder and the close objective lens arranged between the distant objective lens and the immersion objective lens.

The scanning electron microscope according to the present invention therefore uses as many as three objective lenses for focusing the primary electron beam. The distant objective lens and the close objective lens can be electromagnetic or electrostatic or combined. In cases of electromagnetic lenses, the distant objective lens and the close objective lens are conventional lenses. The third lens is an immersion objective lens of the electromagnetic type, which means that the sample is immersed into the magnetic field created by this immersion objective lens.

The microscope condenser lenses in cooperation with the aperture diaphragm serve for regulation of the primary electron beam current. The condenser lenses are usually electromagnetic, but alternatively they may also be electrostatic or combined.

At least one detector of signal electrons is arranged in the scanning electron microscope, either in the sample chamber or in the electron column, for the detection of the signal electrons which are emitted from the sample after the primary electron beam impingement. The term signal electrons includes for example secondary electrons or backscattered electrons. The detector of signal electrons may be arranged in the electron column anywhere between the immersion objective lens and the condenser lens. Advantageously, multiple detectors of signal electrons, which can be utilized depending on the required signal or depending on the combination of the utilized objective lenses, can be arranged in the sample chamber or in the electron column. The detectors of signal electrons may be arranged from the side (perpendicular or sideways to the optical axis) or annularly (around the optical axis). Commonly used types of detectors such as scintillation detector, Everhart-Thornley detector or semiconductor detector can be also used without limitations. Auxiliary electrodes which direct the signal electrons to the detector can be used for better detection. Detectors of other signals can be used in the scanning electron microscope in addition to the detectors of the signal particles, for example detectors of catodoluminescense, x-ray, secondary ions or transmitted electrons.

Other parts of the scanning electron microscope according to the present invention are scanning coils which can be arranged above the distant objective lens, above the close objective lens or below the close objective lens. If at least one active objective lens is below the scanning coils, pivot point of the scanning is generally arranged in the main plane of the last active objective lens which focuses the primary electron beam onto the sample.

To better center the assembly with more lenses, it is convenient to use several centering elements which can be arranged anywhere between the individual lenses.

The sample holder according to the present invention can be modified for applying arbitrary voltage to the sample or directly to the sample holder. Then, the applied voltage generates electrostatic field in the proximity of the sample. If the applied voltage is negative, the generated electrostatic field facilitates the improvement of the resolution of the whole imaging assembly. By applying low positive voltage, a field which can be used for improving detection or regulation of the detected signal type is generated. This electrostatic field can optionally overlap with the magnetic field of the immersion objective lens. This possibility can be utilized in cooperation with the close objective lens, the distant objective lens or the immersion objective lens and with the combinations thereof.

The scanning electron microscope according to the present invention can be further equipped with a second column for focused ion beam which can be used for analysis or treatment of the sample by the focused ion beam.

The objective lenses are in the text described in the active and inactive state for explanation of the functionality of the imaging modes. However, a person skilled in the art will surely understand that the coils or electrodes of all the lenses can be powered by different current or different voltage can be applied, and thus the shape and intensity of the fields can be affected as needed. It is understood that in the case of active lens, this lens generates electromagnetic/electrostatic field or both types of fields in the case of combined lens, and on the contrary, inactive lens does not generate corresponding field. Inactive state of lens also comprises state in which material of the magnetic circuit of the lens generates remanent magnetic field. Further, lens with a coil with a plurality of windings through which the current passes in such a way that the magnetic fields generated by individual windings cancel each other out, meaning that the vector sum of the fields generated by the individual windings in the area of the lens space equals zero, can be considered an inactive lens. Activity of all three objective lenses can be controlled independently of each other. Therefore, different combinations of active and inactive objective lenses can be used. This provides us with possibility of switching between the conventional lenses and the immersion lens of the microscope and we gain the benefits of both.

The method of use of the scanning electron microscope with only the distant objective lens active offers the possibility of imaging the examined sample with large field of view and large depth of focus.

When switching into the mode of focusing the primary electron beam only by the close objective lens, better resolution can be achieved than in the previous case because the active lens is arranged closer to the sample. The field of view and depth of focus are of course smaller than in the previous case.

The method of use of the scanning electron microscope with active immersion objective lens and with inactive close objective lens and inactive distant objective lens gives even higher resolution.

The activity of these three lenses can be combined in various ways and thereby various properties of the image can be achieved. Usually, the active objective lens, the one further from the sample, has a function of optimizing the aperture angle for the closer lens which focuses the electron beam onto the sample.

If only one objective lens is active, the smallest spot of the primary beam is achieved with certain primary beam current, which corresponds to the optimal aperture angle. However, if there is a need to use different primary beam current for the imaging, the location of the crossover created by the condenser lens changes so that the beam does not impinge the objective lens with optimal aperture angle. However, the scanning electron microscope according to the present invention enables the activation of another objective lens arranged between the said objective lens and the aperture diaphragm so that the lens configures the optimal aperture angle of the primary electron beam for the objective lens focusing the beam onto the sample, even for wide range of beam currents. Therefore, if the lens focusing the beam onto the sample is configured for certain optimal aperture angle, this angle can be maintained by means of the distant objective lens even while changing the electron current passing through the aperture diaphragm.

When using the scanning electron microscope with active distant objective lens which serves for optimizing the aperture angle, and simultaneously the close objective lens which focuses on the sample is active, we achieve high resolution for wide range of primary beam currents with relatively large depth of focus, larger than in the case of imaging by means of the immersion lens alone and smaller than in the case of imaging by means of the distant objective lens alone.

It is advantageous for certain types of the examined samples that in this imaging mode, in which the immersion objective lens is inactive, the sample is not immersed into the magnetic field of the immersion objective lens. For example, the examination of the samples made of the magnetic materials is in the magnetic field of the immersion objective lens limited. Activated immersion lens may be also not suitable for example for working simultaneously with focused ion beam because the magnetic field of the immersion objective lens affects the ion beam.

The method of use of the scanning electron microscope with the active immersion objective lens in combination with the distant objective lens or the close objective lens facilitates achieving optimal aperture angle for wide range of currents of the primary electron beam.

Another method of use is when the close objective lens and the immersion objective lens are active in such way that the close objective lens generates a convergent primary electron beam and the immersion objective lens further focuses the primary electron beam onto the sample. The imaging by the immersion objective lens is usually limited to a certain range of working distances of the sample from the lens, especially with high energy of the primary beam. The above-mentioned method of combination of the close and the immersion objective lens enables increase in the range of working distances.

The scanning electron microscope according to the present invention can be also used with active immersion lens so that the condenser lenses generate such weak field that the primary electron beam does not generate the crossover between the condenser lens and the immersion objective lens. In this way, the effects which occur in the crossover with high density of charged particles interacting with each other which can worsen resulting resolution, are suppressed. However, this imaging mode does not enable regulation of the currents of the primary electron beam to such extent as the imaging mode with condenser lenses generating the crossover.

If the scanning electron microscope is equipped with a device with focused ion beam, it can be advantageously used for example for creating structures on the sample. The process of treatment of the sample by focused ion beam can be controlled while imaging by the scanning electron microscope in the imaging modes with active conventional objective lenses, which do not affect the focused ion beam, and when the work is finished it is possible to image the sample in the imaging modes with active immersion objective lens which offers higher resolution. The scanning electron microscope enables automatic switching between various imaging modes.

DESCRIPTION OF DRAWINGS

The invention is further described through the description of the examples of its embodiments by means of accompanying figures. For better clarity, only parts which are considered essential from the point of view of the present invention are shown in the figures.

EXAMPLES OF EMBODIMENTS OF THE INVENTION

Figure 1:
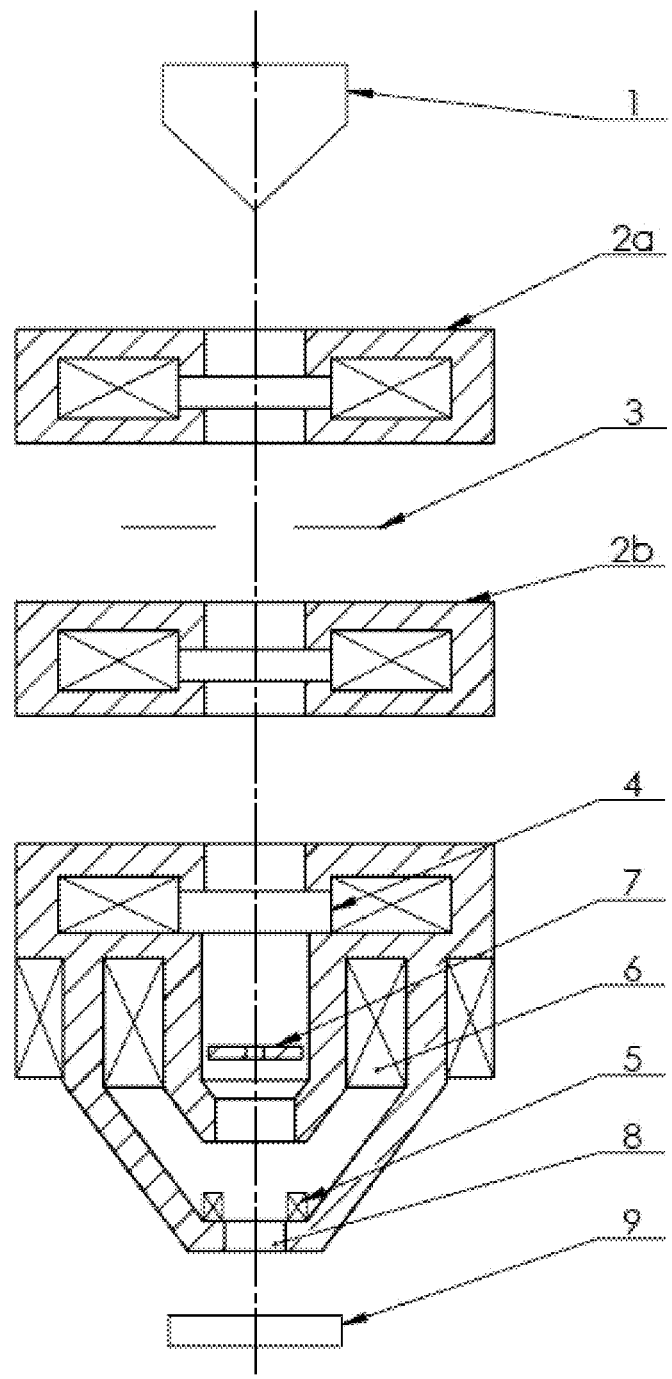
FIG. 1 schematically shows the arrangement of the scanning electron microscope elements.

FIG. 1 shows the arrangement of the scanning electron microscope elements with two condenser lenses and three objective lenses. The source 1 of primary electrons generates the primary electron beam. Electromagnetic condenser lenses 2a and 2b are arranged behind the source 1 of primary electrons in the direction of the sample holder 9. The aperture diaphragm 3 is arranged between the condenser lenses 2a and 2b. The distant objective lens 4 is arranged behind the condenser lenses 2a and 2b in the direction of the sample holder 9. This distant objective lens 4 is electromagnetic of conventional type with an axial gap between the polepieces. Annular detector 7 of signal electrons is arranged below the distant objective lens 4. The annular detector 7 of signal electrons can be for example of scintillation or semiconductor type. The close objective lens 6 is arranged behind the detector 7 of signal electrons. The close objective lens 6 is electromagnetic, conventional with an axial gap between two polepieces. Any of the said electromagnetic lenses (condenser lenses 2a and 2b, the distant objective lens 4 and the close objective lens 6) can be substituted by electrostatic lenses for example of the Einzel lens type in which the focused beam is leaving the lens with the same energy as the one entering the lens. Single-stage scanning coils 5 regulating the scanning of the primary electron beam on the sample surface are arranged inside the close objective lens 6. The immersion objective lens 8 is arranged below the close objective lens 6. The sample holder 9 adapted for attaching the sample is arranged below the immersion objective lens 8. In this example of the embodiment, the immersion objective lens 8 is a single polepiece immersion lens, however, alternatively it can be also a double polepiece immersion lens with radial gap between polepieces. The close double polepiece objective lens 6 and the immersion objective lens 8 are in this embodiment arranged so that their magnetic circuits are interconnected, meaning that the lower magnetic polepiece of the close double polepiece objective lens 6 is also the magnetic polepiece of the immersion objective lens 8.

The primary electron beam generated by the source 1 of primary electrons in this arrangement passes firstly through the condenser lens 2a which together with the aperture diaphragm 3 serves for setting the electron current incident on the sample. The second condenser lens 2b can for example have the function of maintaining a fixed position of the crossover while changing the current passing through the aperture diaphragm 3. The primary electron beam then passes through the distant objective lens 4. If this lens is active, wide field of view and large depth of focus can be advantageously achieved due to its great distance from the sample holder 9. The distant objective lens 4 is therefore intended for imaging mode suitable for the navigation on the sample that is also not immersed in the electromagnetic field generated by the distant objective lens 4. This lens can be advantageously utilized for examination of samples, for which the presence of the electromagnetic field is undesirable, for example of samples from electromagnetic materials. The primary electron beam further passes through the close objective lens 6. If this lens is active, it images smaller field of view than the distant objective lens 4, however, it has better resolution than the distant objective lens 4 because it is closer to the sample holder 9. Subsequently, the primary electron beam passes through the immersion objective lens 8 towards the sample holder 9. This immersion objective lens 8, if active, generates electromagnetic field into which the examined sample is immersed. This enables achieving even better resolution than the close objective lens 6. When the primary electron beam impinges the sample arranged in the sample holder 9, the signal particles are emitted and detected by the detector 7 of signal electrons.

The activity of the individual lenses can be combined and thus multiple imaging modes can be achieved. Position of pivot can be changed by the scanning coils 5 and thereby a further optimization of individual imaging modes can be achieved. Switching between different imaging modes is further beneficial for gradual examination of a number of samples, which are for example arranged at one rotatable sample holder 9. Such samples can for example be intended for further treatment and examination, they can have a different surface structure, they can be magnetic and non-magnetic and they can be intended for a number of different types of examinations and analyses, such as characteristic X-ray radiation detection (Energy/Wavelength Dispersive X-ray Spectroscopy, EDS and WDS), electron diffraction (Electron Backscatter Diffraction, EBSD) cathodoluminescene radiation detection (Cathodoluminescence, CL) and others. The individual objective lenses are active or inactive as needed.

Figure 2:
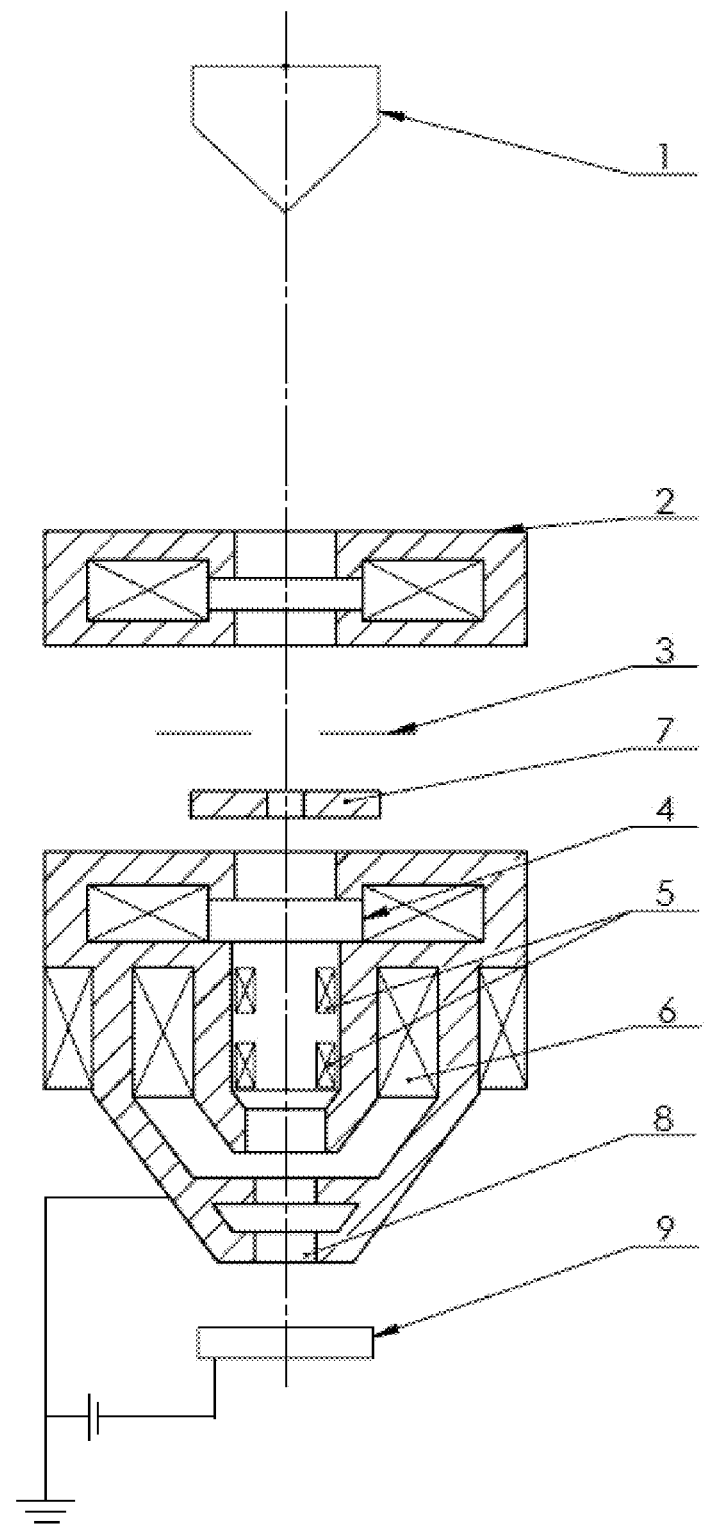
FIG. 2 schematically shows the arrangement of the scanning electron microscope elements in combination with voltage applied to the sample holder.

FIG. 2 shows another example of the scanning electron microscope. In contrast to the FIG. 1, the scanning electron microscope comprises one condenser lens 2. The aperture diaphragm 3 is positioned below the condenser lens 2. Next comes the annular detector 7 of signal electrons. The device further comprises double-stage scanning coils 5, which are arranged below the distant objective lens 4. The close objective lens 6 and the immersion objective lens 8 have overlapping magnetic circuits, but each of the lenses has its own polepieces. The sample holder 9 is modified for applying voltage onto the sample. The applied voltage generates electrostatic field between the sample holder 9 and the polepiece of the immersion objective lens 8, which can affect the primary electron beam. The electrostatic field decelerating the primary electron beam is created by applying negative voltage to the sample. This enables reduction of the optical aberrations of the scanning electron microscope column and better resolution. Alternatively, positive voltage can be applied to the sample holder 9.

The activity of the individual lenses can be combined and thus multiple imaging modes can be achieved as in the previous embodiment. Position of pivot can be changed by the two-stage scanning coils 5 and thereby a further optimization of individual imaging modes can be achieved.

Figure 3:
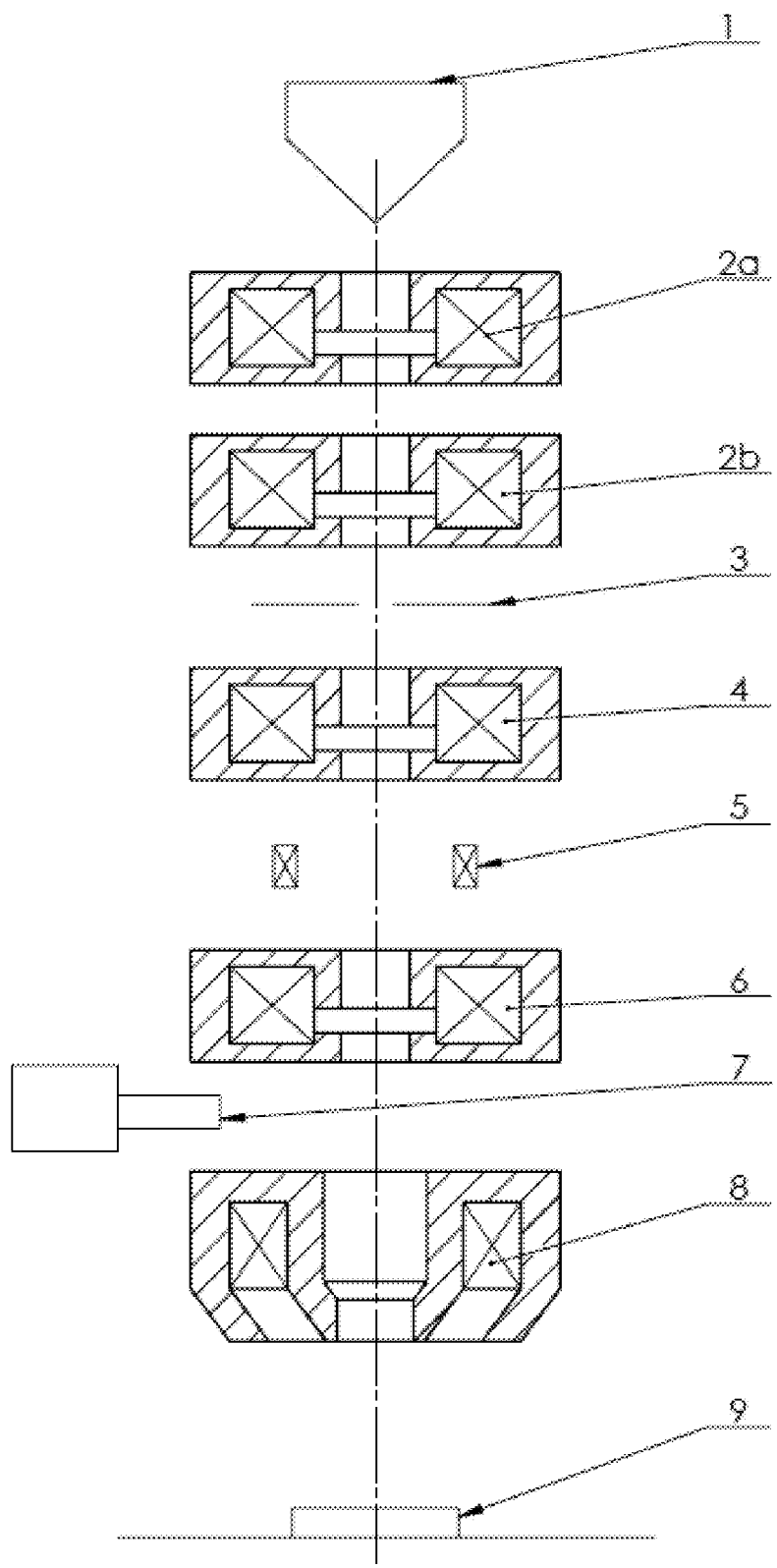
FIG. 3 schematically shows the arrangement of the scanning electron microscope elements with completely separated magnetic circuits of the individual lenses.

FIG. 3 shows another example of the embodiment of the scanning electron microscope. It comprises aperture diaphragm 3 arranged below the condenser lenses 2a and 2b. The distant objective lens 4, the close objective lens 6 and the immersion objective lens 8 are separated from each other and their magnetic circuits are not interconnected. The immersion objective lens 8 is a double polepiece lens with a radial gap between polepieces. The device further comprises scanning coils 5 arranged between the close objective lens 6 and the distant objective lens 4 and the detector 7 of signal electrons arranged from the side. As in the case of the annular detector, this detector 7 of signal electrons can be of different types, optionally multiple detectors arranged from the side or in combination with the annular detectors can be used.

The scanning electron microscopes shown in the FIGS. 1, 2 and 3 are only examples of the embodiments of the present invention. A person skilled in the art will understand that there are other possible combinations of the above described embodiments. The device can also be supplemented with more components used in the scanning electron microscopes such as monochromators, optical aberrations correctors and the like.

Figure 4:
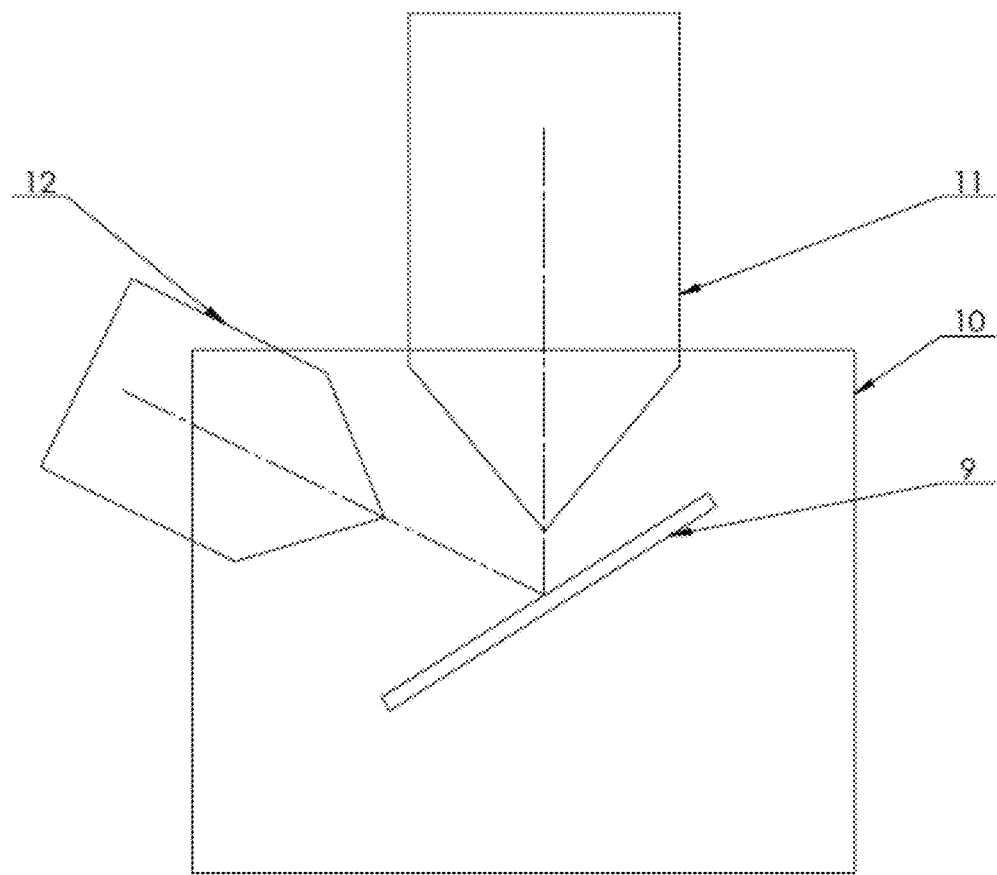
FIG. 4 schematically shows device comprising scanning electron microscope and device utilizing focused ion beam.

FIG. 4 shows scheme of a device comprising working vacuum chamber 10, in which the scanning electron microscope 11 described above, device 12 utilizing focused ion beam and sample holder 9 are arranged. Relative position of optical axes of the scanning electron microscope 11 and the device 12 utilizing focused ion beam may be coincidental, parallel or other.

Figure 5:
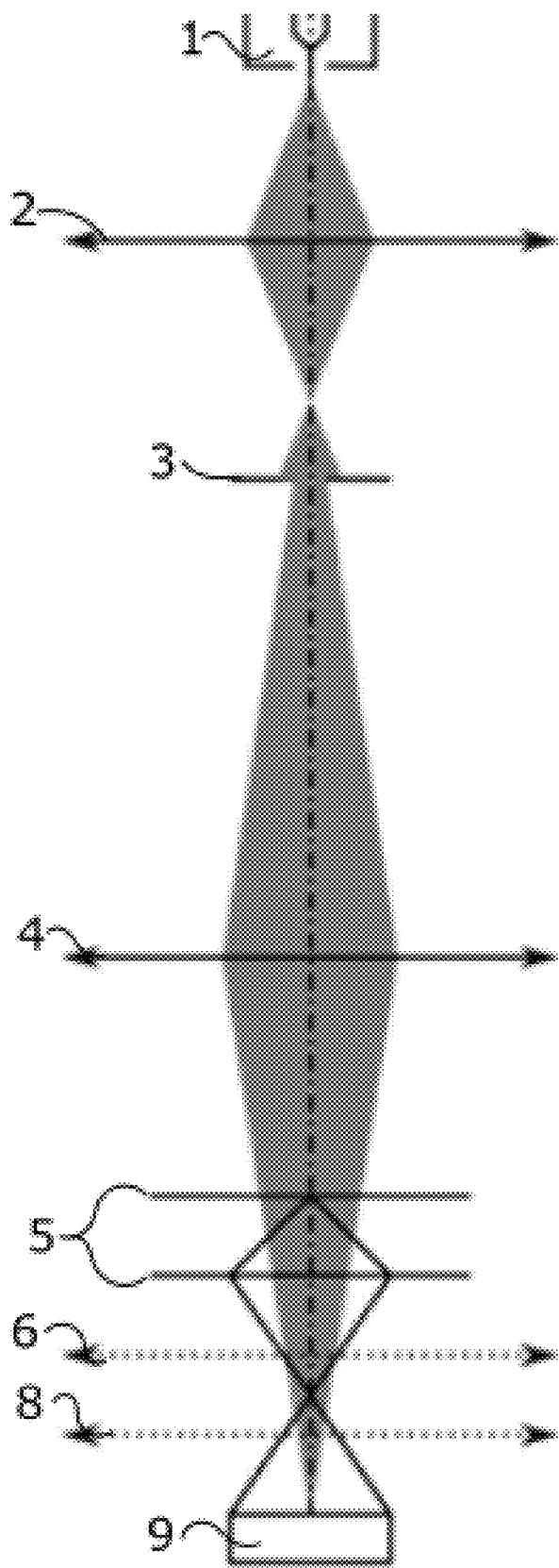
FIG. 5 shows imaging mode of the scanning electron microscope in which the immersion objective lens and the close objective lens are inactive and the distant objective lens is active.

FIG. 5 shows scheme of an imaging mode which is commonly used in the first phase of the sample examination, when the immersion objective lens 8 and the close objective lens 6 are inactive and only the distant objective lens 4 is active. This imaging mode enables large field of view thus imaging of a large surface portion of the examined sample or even of several samples arranged in the sample holder 9 at the same time, and a large depth of focus without magnetic field on the sample.

Figure 6:
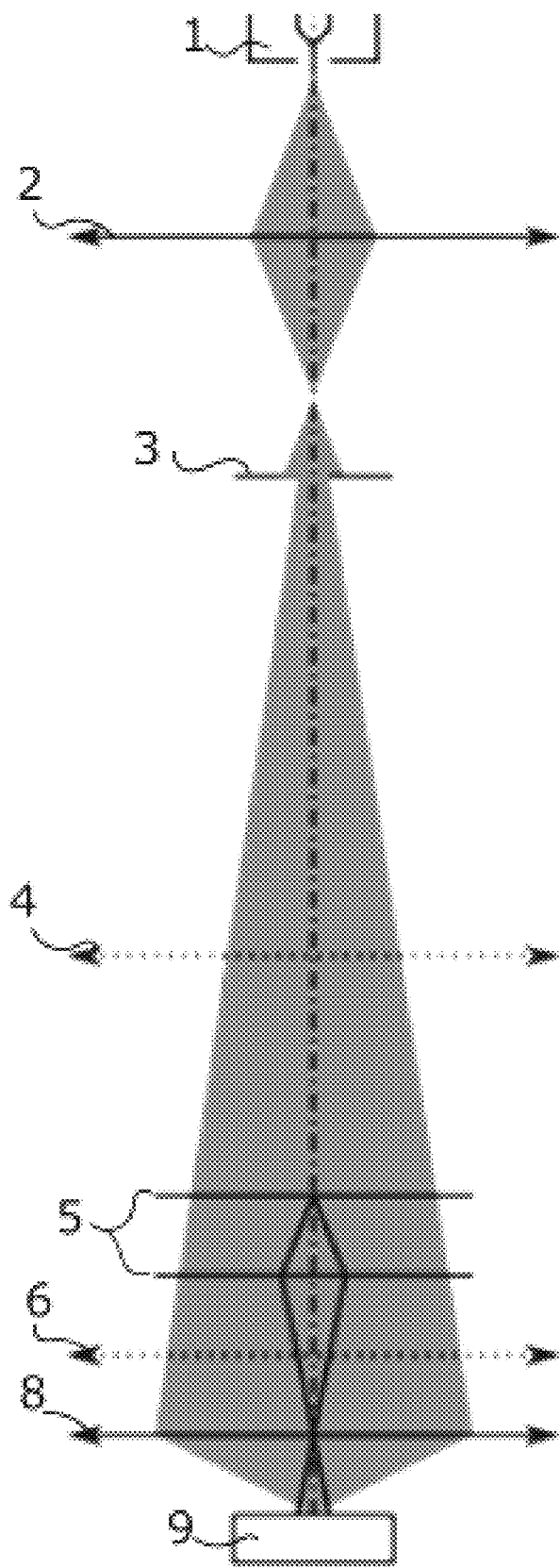
FIG. 6 shows imaging mode of the scanning electron microscope in which the immersion objective lens is active and the close and distant objective lenses are inactive.
Figure 7:
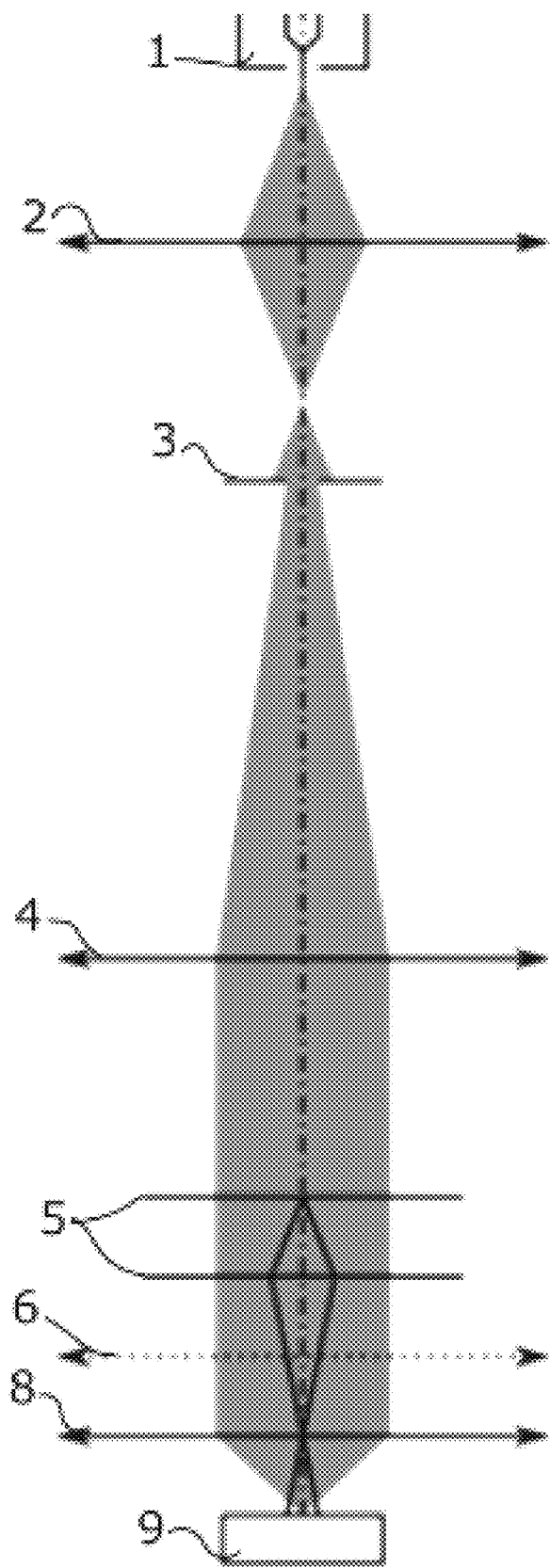
FIG. 7 shows imaging mode of the scanning electron microscope in which the immersion objective lens and the distant objective lens are active and the close objective lens is inactive.
Figure 8:
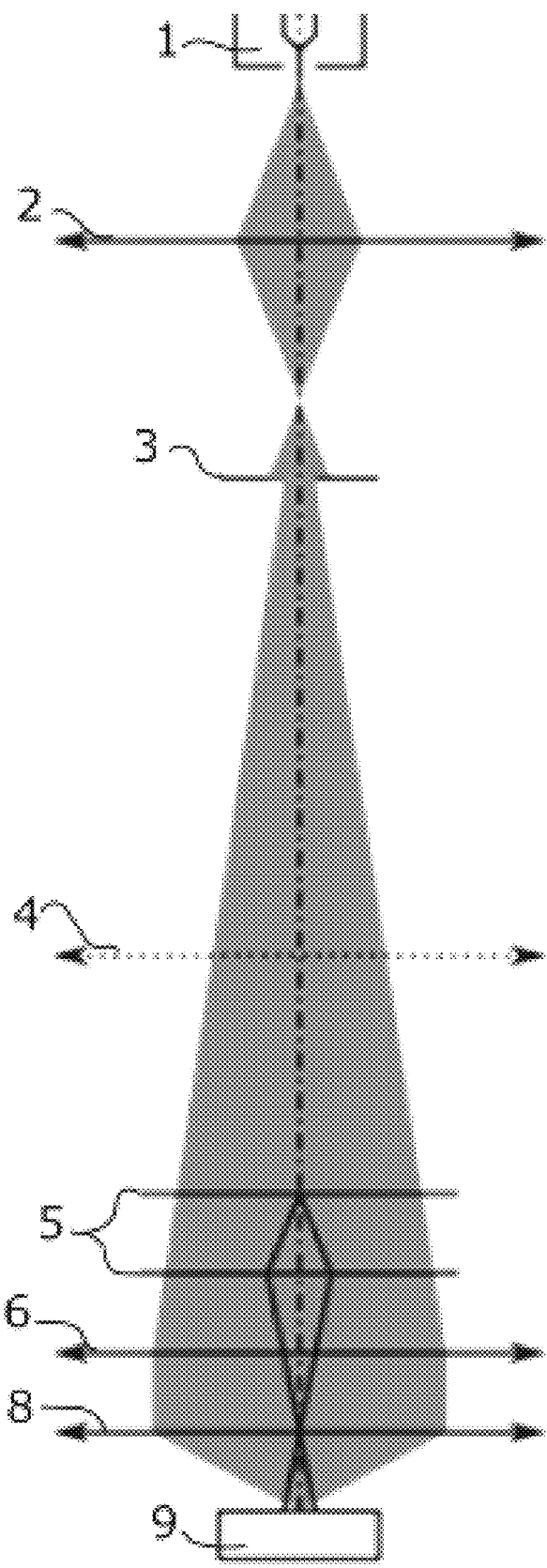
FIG. 8 shows imaging mode of the scanning electron microscope in which the immersion objective lens and the close objective lens are active and the distant objective lens is inactive.
Figure 9:
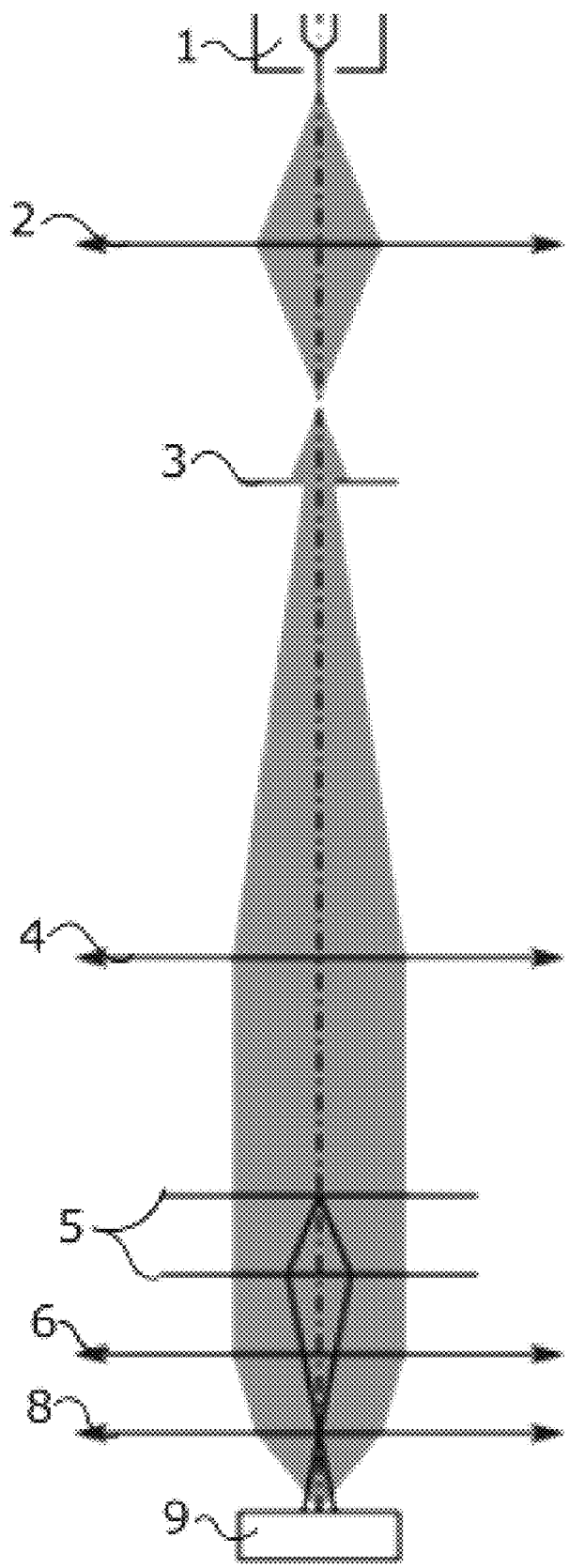
FIG. 9 shows imaging mode of the scanning electron microscope in which the immersion objective lens, the close objective lens and the distant objective lens are active.

FIGS. 6, 7, 8 and 9 are schemes of imaging modes with active immersion objective lens 8. If the close objective lens 6 and the distant objective lens 4 are inactive and only the immersion objective lens 8 is active, state with high resolution of the imaged sample surface is achieved and the sample is immersed in the magnetic field. A drawback is represented by a relatively small depth of focus during examination and a small field of view. This possibility is shown in FIG. 6. FIG. 7 shows an imaging mode in which the electron primary beam can be further focused by combination of active immersion objective lens 8 and active distant objective lens 4. The advantage of this imaging mode is high resolution with wide range of currents of the primary electron beam. Moreover, in the case of additional activation of the close objective lens 6 (FIG. 9), dynamic focusing is enabled, for example, during scanning the primary beam over the surface of the tilted sample. FIG. 8 shows imaging mode with active immersion objective lens 8 and close objective lens 6. The close objective lens 6 can serve for optimization of the aperture angle or for creation of a convergent beam. The advantage of creating the convergent beam is the possibility to focus at smaller working distance at high electron energies than in the case of the active immersion lens 8 alone. Moreover, optimization of the aperture angle can be achieved by additional activation of the distant objective lens 4. FIG. 9 shows the above-mentioned combination of the active objective lenses 4, 6 and 8.

Figure 10:
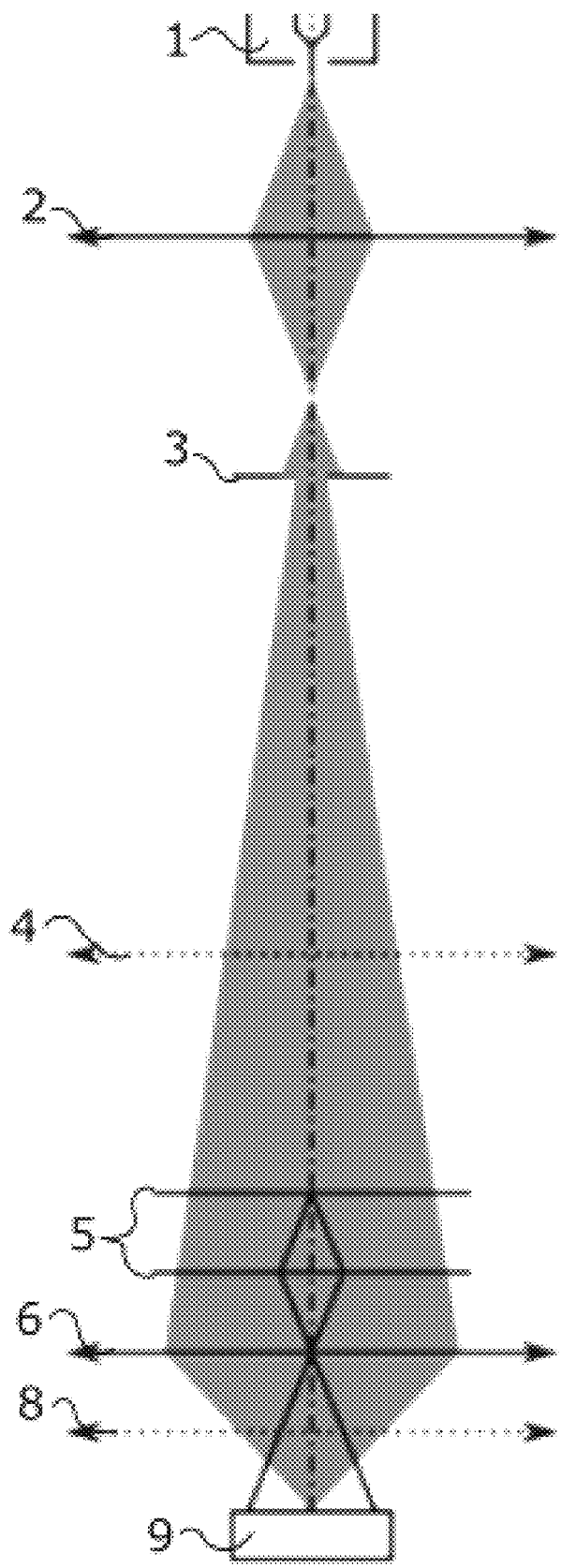
FIG. 10 shows imaging mode of the scanning electron microscope in which the immersion objective lens and the distant objective lens are inactive and the close objective lens is active.
Figure 11:
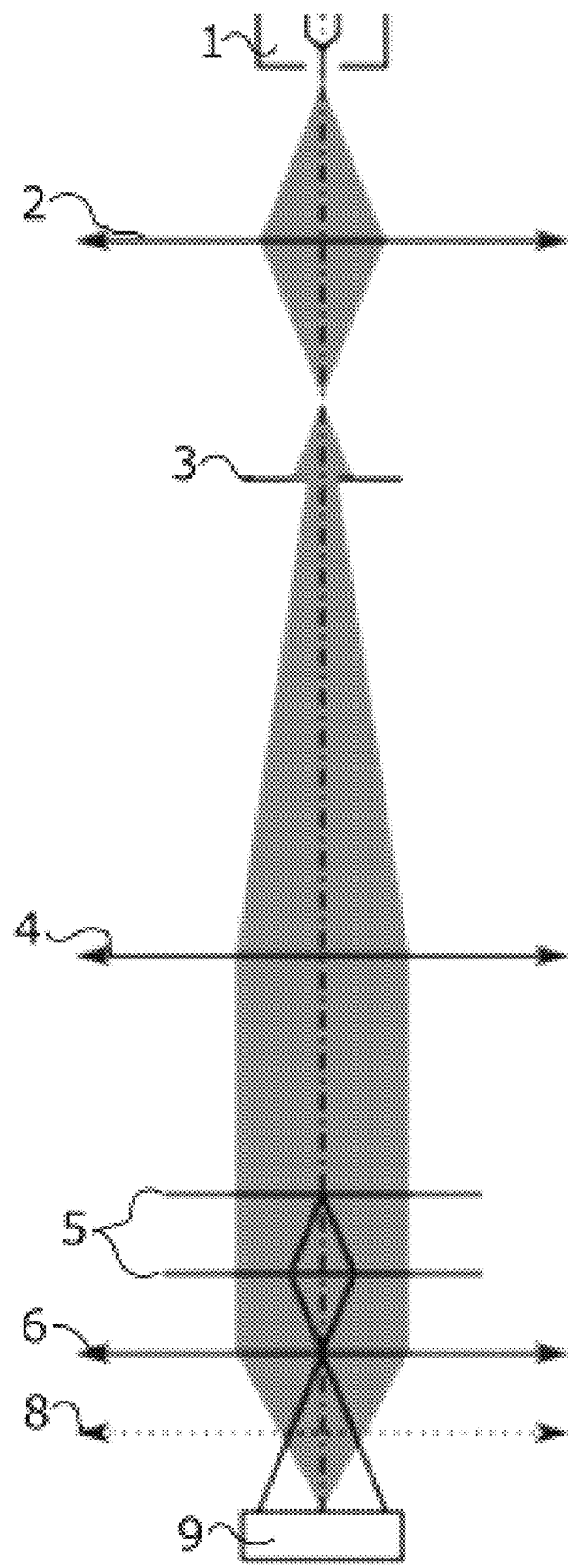
FIG. 11 shows imaging mode of the scanning electron microscope in which the immersion objective lens is inactive and the close objective lens and the distant objective lens are active.

FIGS. 10 and 11 are schemes of the imaging modes with inactive immersion objective lens 8 and active close objective lens 6. In these cases, it is possible to examine the surfaces of samples which cannot be immersed in the magnetic field (for example for examination of magnetic materials or for simultaneous work with the focused ion beam). In the imaging mode in FIG. 11, the distant objective lens 4 can serve for optimization of the aperture angle and the close objective lens 6 can serve for focusing on the sample. The position of the pivot point of the scanning is in this case in the main plane of the close objective lens 6. In this way, good resolution with wide range of currents in the beam is achieved. If the distant objective lens 4 serves for focusing on the sample and the close objective lens 6 serves for bending the beam and creating pivot of the scanning coils 5, the first pivot is located above the close objective lens 6 and the second pivot is created below it so that the bending angle of the beam is maximized. The advantage of this imaging mode is represented by large depth of focus and maximal field of view. If the distant objective lens 4 serves for creating a crossover and the close objective lens 6 serves for creating parallel beam and its bend into the examined place on the sample, the pivot is created in the sample plane. The advantage of this imaging mode is the possibility of crystal plane analysis, in which the parallel beam impinges the same place under variable angle.

Figure 12:
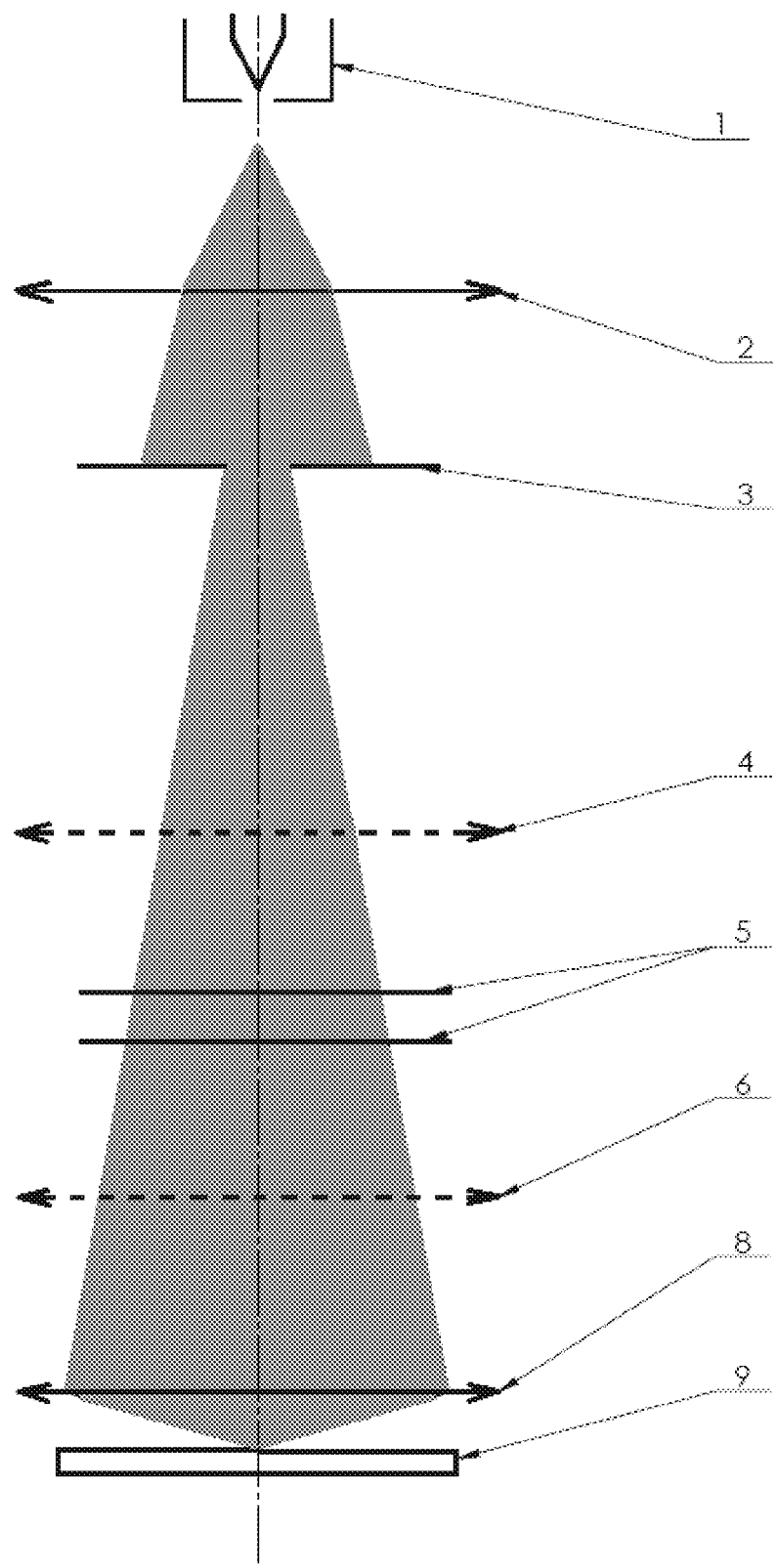
FIG. 12 shows imaging mode of the scanning electron microscope in which the immersion objective lens is active, both the close and the distant objective lenses are inactive and in which the condenser lenses do not create a real crossover of the electron beam.

FIG. 12 shows an imaging mode in which the condenser lenses 2 do not create real crossover of the primary electron beam, they only change its divergence in order to optimize the angle of the primary electron beam passing through the aperture diaphragm 3. In this imaging mode, it is also possible to inactivate the condenser lenses 2 completely.

The present invention allows using the objective lenses according to desired conditions. It is therefore understood that the active objective lenses can be combined differently or the objective lenses can be used individually.

LIST OF REFERENCE SIGN

1—Source of primary electrons
2—Condenser lenses (a, b)
3—Aperture diaphragm
4—Distant objective lens
5—Scanning coils
6—Close objective lens
7—Detector of signal electrons
8—Immersion objective lens
9—Sample holder
10—Vacuum chamber
11—Scanning electron microscope
12—Device utilizing focused ion beam

The invention claimed is:

1. A scanning electron microscope comprising a source of primary electrons, at least one condenser lens, an aperture diaphragm, scanning coils, at least one detector of signal electrons, a sample holder, a distant objective lens arranged between the at least one condenser lens and the sample holder, an immersion objective lens arranged between the distant objective lens and the sample holder, and a close objective lens arranged between the distant objective lens and the immersion objective lens, wherein the objective lenses are configured to be controlled to cause at least one of the objective lenses to be active while at least another one of the objective lenses in inactive.

2. The scanning electron microscope according to claim 1, wherein any lens from the group consisting of the at least one condenser lens, the distant objective lens and the close objective lens is electromagnetic.

3. The scanning electron microscope according to claim 1, wherein any lens from the group consisting of the at least one condenser lens, the distant objective lens and the close objective lens is electrostatic.

4. The scanning electron microscope according to claim 1, wherein the immersion objective lens is a single polepiece lens.

5. The scanning electron microscope according to claim 1, wherein the immersion objective lens is a double polepiece lens.

6. The scanning electron microscope according to claim 1, wherein the sample holder is modified for applying voltage onto the sample.

7. The scanning electron microscope according to claim 1, wherein the scanning coils are arranged above the close objective lens.

8. The scanning electron microscope according to claim 7, wherein the scanning coils are arranged above the distant objective lens.

9. The scanning electron microscope according to claim 1, wherein the scanning coils are arranged below the close objective lens.

10. The scanning electron microscope according to claim 1, further comprising a device utilizing focused ion beam.

11. A method of use of a scanning electron microscope comprising a source of primary electrons, at least one condenser lens, an aperture diaphragm, scanning coils, at least one detector of signal electrons, a sample holder, a distant objective lens arranged between the at least one condenser lens and the sample holder, an immersion objective lens arranged between the distant objective lens and the sample holder, characterized in that it further comprises a close objective lens arranged between the distant objective lens and the immersion objective lens, comprising the step of:
rendering at least one of the objective lenses active while at least another one of the objective lenses is inactive.

12. A method of use of a scanning electron microscope comprising a source of primary electrons, at least one condenser lens, an aperture diaphragm, scanning coils, at least one detector of signal electrons, a sample holder, a distant objective lens arranged between the at least one condenser lens and the sample holder, an immersion objective lens arranged between the distant objective lens and the sample holder, and a close objective lens arranged between the distant objective lens and the immersion objective lens, the method comprising the steps of:
rendering the at least one condenser lens active in such a way that the primary electrons do not create a real crossover between the at least one condenser lens and the immersion objective lens, and
rendering the immersion objective lens inactive while activating the distant objective lens.

13. The method of use of the scanning electron microscope according to claim 12, wherein the close objective lens is inactive.

14. The method of use of the scanning electron microscope according to claim 11, further comprising the step wherein the immersion objective lens is activated.

15. A method of use of a scanning electron microscope comprising a source of primary electrons, at least one condenser lens, an aperture diaphragm, scanning coils, at least one detector of signal electrons, a sample holder, a distant objective lens arranged between the at least one condenser lens and the sample holder, an immersion objective lens arranged between the distant objective lens and the sample holder, characterized in that it further comprises a close objective lens arranged between the distant objective lens and the immersion objective lens, the method comprising the steps of:
rendering the at least one condenser lens active in such a way that the primary electrons do not create a real crossover between the at least one condenser lens and the immersion objective lens, wherein the immersion objective lens is activated, and
wherein the distant objective lens is inactive and the close objective lens is inactive.

16. A method of use of a scanning electron microscope comprising a source of primary electrons, at least one condenser lens, an aperture diaphragm, scanning coils, at least one detector of signal electrons, a sample holder, a distant objective lens arranged between the at least one condenser lens and the sample holder, an immersion objective lens arranged between the distant objective lens and the sample holder, characterized in that it further comprises a close objective lens arranged between the distant objective lens and the immersion objective lens, the method comprising the steps of:
rendering the at least one condenser lens active in such a way that the primary electrons do not create a real crossover between the at least one condenser lens and the immersion objective lens, wherein the immersion objective lens is activated, and
wherein the distant objective lens is active and the close objective lens is inactive.

17. A method of use of a scanning electron microscope comprising a source of primary electrons, at least one condenser lens, an aperture diaphragm, scanning coils, at least one detector of signal electrons, a sample holder, a distant objective lens arranged between the at least one condenser lens and the sample holder, an immersion objective lens arranged between the distant objective lens and the sample holder, characterized in that it further comprises a close objective lens arranged between the distant objective lens and the immersion objective lens, the method comprising the steps of:
rendering the at least one condenser lens active in such a way that the primary electrons do not create a real crossover between the at least one condenser lens and the immersion objective lens, wherein the immersion objective lens is activated,
wherein the distant objective lens is inactive and the close objective lens is active.

18. The method of use of the scanning electron microscope according to claim 14, wherein the distant objective lens is active and the close objective lens is active.

19. A method of use of a scanning electron microscope comprising a source of primary electrons, at least one condenser lens, an aperture diaphragm, scanning coils, at least one detector of signal electrons, a sample holder, a distant objective lens arranged between the at least one condenser lens and the sample holder, an immersion objective lens arranged between the distant objective lens and the sample holder, characterized in that it further comprises a close objective lens arranged between the distant objective lens and the immersion objective lens, the method comprising the steps of:
rendering the at least one condenser lens active in such a way that the primary electrons do not create a real crossover between the at least one condenser lens and the immersion objective lens, wherein the immersion objective lens is activated, and
rendering the immersion objective lens inactive and activating the close objective lens.

20. The method of use of the scanning electron microscope according to claim 19, wherein the distant objective lens is inactive.

21. The method of use of the scanning electron microscope according to claim 19, wherein the distant objective lens is active.

22. The scanning electron microscope according to claim 1, wherein the at least one condenser lens, the sample holder, the distant objective lens, the immersion objective lens and the close objective lens are linearly arranged with spacing therebetween.

23. The scanning electron microscope according to claim 1, wherein the at least one condenser lens, the sample holder, the distant objective lens, the immersion objective lens and the close objective lens are axially arranged with spacing therebetween.

24. The scanning electron microscope according to claim 1, wherein the distant objective lens is arranged entirely between the at least one condenser lens and the sample holder, the immersion objective lens is arranged entirely between the distant objective lens and the sample holder, and the close objective lens is arranged entirely between the distant objective lens and the immersion objective lens.

25. The scanning electron microscope according to claim 1, wherein the scanning coil is configured to scan the primary electrons in relation to a surface of a sample.

* * * * *